United States Patent
Cox et al.

(10) Patent No.: US 6,191,950 B1
(45) Date of Patent: Feb. 20, 2001

(54) SNAP-TOGETHER PRINTED CIRCUIT CARD COVER WITH INTEGRAL CARD SUPPORT

(75) Inventors: Wilton L. Cox, Charlotte; Simon D. Yu, Harrisburg, both of NC (US)

(73) Assignee: International Business Machines Corporation, Armonk, NY (US)

( * ) Notice: Under 35 U.S.C. 154(b), the term of this patent shall be extended for 0 days.

(21) Appl. No.: 09/212,120

(22) Filed: Dec. 15, 1998

(51) Int. Cl.⁷ .................................................. H05K 1/74
(52) U.S. Cl. ........................ 361/737; 361/736; 361/816; 361/818; 174/35 R
(58) Field of Search ................................. 361/736, 737, 361/752, 754, 756, 759, 801, 802; 174/35 R

(56) References Cited

U.S. PATENT DOCUMENTS

| | | | |
|---|---|---|---|
| 5,014,160 | * 5/1991 | McCoy, Jr. | 361/424 |
| 5,144,533 | * 9/1992 | Arnett | 361/736 |
| 5,160,807 | * 11/1992 | Fry et al. | 174/35 R |
| 5,339,222 | 8/1994 | Simmons et al. | 361/818 |
| 5,353,201 | * 10/1994 | Maeda | 361/816 |
| 5,548,483 | * 8/1996 | Feldman | 361/737 |
| 5,563,770 | 10/1996 | Bethurum | 361/737 |
| 5,563,771 | 10/1996 | Bethurum | 361/737 |
| 5,574,628 | 11/1996 | Persia et al. | 361/737 |
| 5,673,181 | 9/1997 | Hsu | 361/760 |
| 5,689,405 | 11/1997 | Bethurum | 361/737 |
| 5,726,867 | 3/1998 | Zarreii | 361/818 |

FOREIGN PATENT DOCUMENTS 2057518   12/1991   (CA) .

OTHER PUBLICATIONS

PCMCIA (Personal Computer Memory Card International Association); "PC Card Standard"; Feb., 1995; pp. 30–34.
IBM Technical Disclosure Bulletin, vol. 37, No. 08, Aug. 1994.

* cited by examiner

Primary Examiner—Jeffrey Gaffin
Assistant Examiner—Tuan Dinh
(74) Attorney, Agent, or Firm—Ratner & Prestia; Lawrence R. Fraley, Esq.

(57) ABSTRACT

A printed circuit card assembly. The assembly comprises a single-piece, stamped bottom cover having a plurality of tabs, each tab having apertures; a printed circuit card having a plurality of slots, each slot adapted to receive one of the tabs; and a single-piece, stamped top cover having opposite sides, a side rail on each side, and a plurality of prongs extending from each side rail, the prongs adapted to snap fit into the apertures in the tabs when the top and bottom cover are joined.

8 Claims, 3 Drawing Sheets

SNAP-TOGETHER PRINTED CIRCUIT CARD COVER WITH INTEGRAL CARD SUPPORT

TECHNICAL FIELD

The present invention relates generally to printed circuit (PC) cards and protective covers used in computers and, more specifically, to a PC card that meets the Personal Computer Memory Card International Association (PCMCIA) PC Card standard.

BACKGROUND OF THE INVENTION

Small credit-card-sized printed circuit (PC) memory cards that plug into slots in computer hardware have become standard in the industry, especially for portable computers. The Personal Computer Memory Card International Association (PCMCIA) develops and releases the "PC Card Standard" that defines parameters for PC memory cards. Cards and hardware developed by various manufacturers will be compatible if they are manufactured in conformance with the standard. Although the PCMCIA PC Card Standard may be periodically updated with new "Releases," a PC card assembly that conforms to any Release of the standard may generally be referred to in the art as a "PCMCIA PC Card assembly."

Release 2.0 of the PC Card Standard sets the size of extended version cards at 85.6 mm long and 54.0 mm wide. These dimensions correspond to the size of a standard credit card. Referring now to FIG. 1, there is shown an illustration of a standard PC Card 100. PC card 100 has a card guide first section 102, with a first standard thickness, and a second section 104 that is of a second standard thickness depending on the card type. For instance, second section 104 of a Type I card is 3.3 mm thick; a Type II card, such as is shown in FIG. 1, is 5 mm thick; and a Type III card is 10.5 mm thick. Some PC cards also include a battery 106, a write-protect switch 108, and a grounding clip 112. The standard also includes specifications for a 68-pin interface connector, mounting at connecting end 110, and the size of the slot in the hardware that receives the card.

The PC Card Standard includes minimum structural requirements for withstanding torque, bending, impact (drop), shock, vibration, warping, moisture, and other mechanical requirements. The cards are also required to meet standards for withstanding electromagnetic interference (EMI), radio frequency (RF) waves, and electrostatic discharge (ESD). These standards are usually met by enclosing the card in a protective metal cover. PC cards may also be required to meet standards set by the Joint Electronic Device Engineering Council (JEDEC), International Standards Organization (IPSO), and others.

The PC cards are used for flash memory, networking, modem connections to telephone systems, hard drives, cellular telephone connection, sound cards, and input/output (I/O) interface with other external peripheral hardware. Although laptop and palmtop systems are the primary users of PC cards, recent desktop systems have also incorporated card slots.

A number of assemblies comprising a card in its protective metal cover and conforming to the PCMCIA PC Card Standard are currently manufactured by a variety of suppliers. Such assemblies generically comprise a top cover and a bottom cover; the PC card is held between the top and bottom covers. Most of these covers require ultrasonic welding, laser welding, or adhesive bonding to adhere the components together. Such operations slow the assembly process, add cost, and introduce additional opportunities for error.

Many of these covers also require that the card be mounted in a special frame. Although it is known to make a cover assembly that snaps together, rather than being bonded, such snap-together covers have included special frames. Such frames are included either as a dielectric piece integrally molded into one of the metal covers or integral to a forged or die-cast, all-metal, unitary bottom cover.

The deficiencies of the conventional PC card assemblies show that a need still exists for an improved assembly. To overcome the shortcomings of the conventional assemblies, a new printed circuit card assembly is provided. An object of the present invention is to avoid processing steps such as ultrasonic welding, laser welding, and adhesive bonding. Another object is to provide a printed circuit card assembly that does not require an additional frame to hold the circuit board.

SUMMARY OF THE INVENTION

To achieve these and other objects, and in view of its purposes, the present invention provides an improved printed circuit card assembly. The assembly comprises the following elements:

a) a unitary bottom cover having a periphery and a plurality of tabs extending perpendicular from the periphery, each tab having an aperture in the tab;

b) a printed circuit card having a plurality of slots, each slot adapted to receive one of the tabs through the slot; and c) a unitary top cover having opposite sides, a side rail on each side, and a plurality of prongs extending from each side rail, the prongs adapted to fit into the apertures in the tabs when the top and bottom cover are joined.

It is to be understood that both the foregoing general description and the following detailed description are exemplary, but are not restrictive, of the invention.

BRIEF DESCRIPTION OF DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures.

DETAILED DESCRIPTION OF INVENTION

Figure 2:
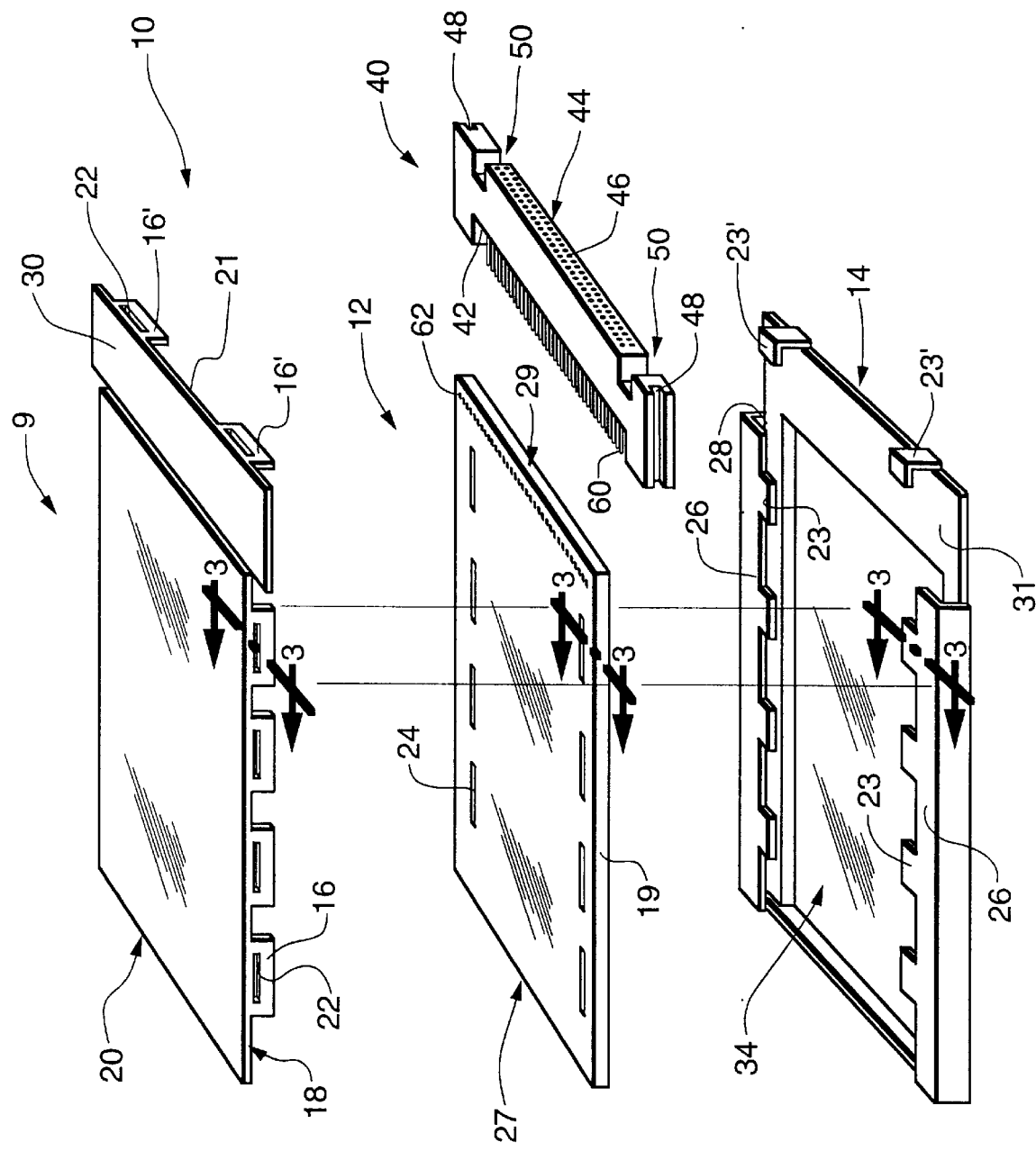
FIG. 2 is an exploded side view illustrating an exemplary PC card of the present invention.
Figure 3:
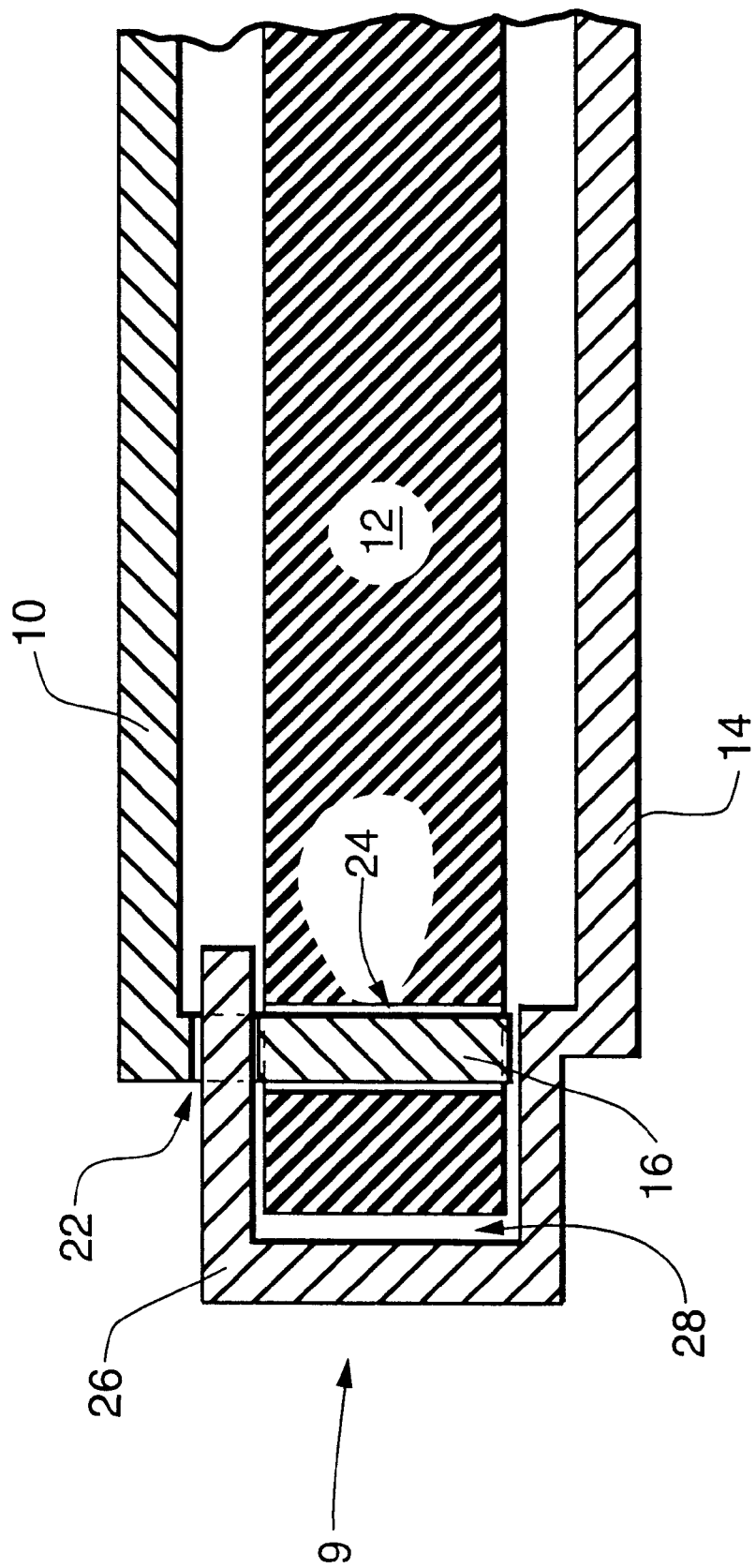
FIG. 3 is a cross-sectional view, illustrating the interface between the card and covers, taken along the line 3—3 of FIG. 2.

Throughout the drawing, like reference numerals refer to like elements. FIGS. 2 and 3 show an exploded side view illustration and a cross-sectional side view illustration, respectively, of an exemplary inverted PC card assembly 9 of the present invention. The exemplary PC card assembly 9 comprises a bottom cover 10, a circuit board 12, a top cover 14, and a connector 40.

Bottom cover 10 has a plurality of tabs 16 spaced on each side edge 18 of its periphery, and one or more tabs 16' on one or both of the connector ends 20 and 21. Each tab 16, 16' has an aperture 22. Circuit board 12 has a plurality of slots 24, each spaced to align with a tab 16 of the bottom cover 10 so that, when assembled, the circuit board 12 is supported and held in place by the tabs 16 interlocked in the slots 24. As shown in FIG. 3, slots 24 are internal slots, meaning that the slots are positioned internally of the card's periphery such that each slot comprises an opening entirely surrounded by card material. Because of the integral support provided by the interface of slots 24 in circuit board 12 and tabs 16 of bottom cover 10, no additional frame is needed to hold the circuit board 12.

As shown in FIG. 3, top cover 14 has a channel-shaped cross section. Thus, side rail 26, which corresponds to first section 102 of FIG. 1, has a channel 28 deep enough to accommodate side edges 19 of circuit board 12. A plurality of prongs 23 and 23' are spaced to align with apertures 22 in tabs 16 and 16' of bottom cover 10.

Connector 40 has an inner end 42 that connects to end 29 of circuit board 12 and an outer end 44. Outer end 44 may further comprise a 68-pin interface 46, in conformance with the current standard in the industry. Interface 46 comprises 68 holes each having a conductive lining that is integrally attached to one of a plurality of conductive solder leads 60. These solder leads 60 are soldered to solder pads 62 on circuit board 12 to attach connector 40 to circuit board 12.

Connector 40 may also comprise side guides 48 that guide PC card assembly 9 into its corresponding hardware port (not shown). Tabs 16' on bottom cover 10 and associated prongs 23' on top cover 14 are spaced consistent with indents 50 in connector 40 to secure connector 40 in place. Side guides 48 are exposed on opposite sides between bottom cover 10 and top cover 14 between prongs 23' and side rail 26. Similarly, interface 46 is exposed between prongs 23'. Thus, in operation, side guides 48 guide PC card assembly 9 into an appropriate hardware port (not shown), where connector 40 electrically connects the circuitry (not detailed) attached to solder pads 62 on circuit board 12 to the hardware device (not shown) via interface 46 and solder leads 60.

Tabs 16 on bottom cover 10 are aligned in slots 24 and integrally support circuit board 12 within the assembled PC card assembly 9. Prongs 23 and 23' are aligned in apertures 22 of tabs 16 and 16' and hold the covers 10 and 14 together. The circuit board 12 is thus protected inside the enclosure formed by bottom cover 10 and top cover 14.

Figure 1:
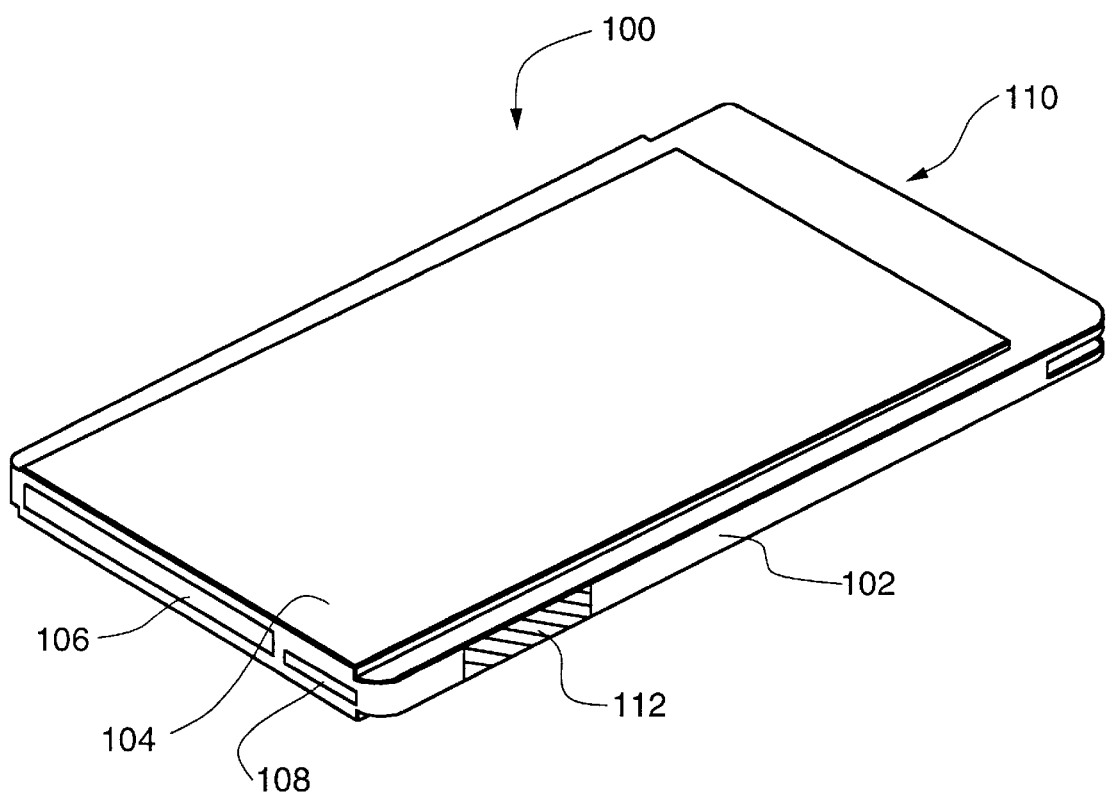
FIG. 1 is a side-view illustrating a standard PC card of the prior art.

PC card assembly 9 may further comprise other device components (not shown) that interface with end 27 of circuit board 12. For instance, a battery, a connector, and other devices may be accessible on end 27. Some of these devices are illustrated in FIG. 1.

Both top cover 14 and bottom cover 10 may be constructed of stamped metal such as aluminum. Stamping provides lower-cost manufacture than forged or die-cast parts, and metal is preferable to provide strength and conductivity for shielding of the circuit board 12 inside the enclosure defined by top cover 14 and bottom cover 10. Both the channel-shaped cross section of the top cover 14 and the L-shaped cross-section of the tabs 16 of bottom cover 10 provide some amount of rigidity to the PC card assembly 9. The circuit board 12 itself adds rigidity because it is an integral part of the structure via tabs 16 in slots 24. Thus, when prongs 23 and 23' are inserted in apertures 22 in tabs 16 and 16', both top cover 14 and bottom cover 10 provide mechanical strength in the assembly.

The PC card assembly 9 of the present invention may be made in conformance with the PCMCIA PC card standard, specifically for Type II and Type III PC cards. Thus, as shown in FIG. 2, circuit board 12 fits within the recessed portion 34 of top cover 14. Recessed portion 34 corresponds to second, thicker portion 104 in FIG. 1, which may be a deeper recess for Type III cards than for Type II cards. Consistent with this standard, end portion 30 of bottom cover 10 and end portion 31 of top cover 14 have no circuit board between them; rather, end portion 30 and end portion 31 cover interface connector 40.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A printed circuit card assembly comprising:
   a) a unitary bottom cover having a periphery and a plurality of tabs extending perpendicular from the periphery, each tab having an aperture therein;
   b) a printed circuit card having a plurality of internal slots, each slot adapted to receive on e of said tabs therethrough; and
   c) a unitary top cover having opposite sides, a side rail on each side, and a plurality of prongs extending from each side rail toward a center of the top cover, each prong adapted to snap fit into the aperture in one of said tabs when said top and bottom cover are joined.

2. The printed circuit card assembly according to claim 1, wherein said bottom cover and said top cover cooperate to provide mechanical strength in the assembly when said prongs are inserted in said apertures in said tabs.

3. The printed circuit card assembly according to claim 1, wherein said assembly comprises a PCMCIA PC Card assembly.

4. The printed circuit card assembly according to claim 1 further comprising:
   a connector attached to said printed circuit card, said connector comprising opposite side guides each adapted to guide said printed circuit card into a port in a hardware device, an interface adapted to electrically connect said printed circuit card to said hardware device, and one or more indents each aligned with one of said tabs on the bottom cover;
wherein said top cover has an end with one or more protruding prongs, each prong adapted to snap-fit into the aperture in one of said tabs aligned with said indent.

5. A printed circuit card assembly consisting essentially of:
   a) a unitary, stamped-metal bottom cover having a periphery and a plurality of tabs extending perpendicular from said periphery, each tab having an aperture therein;
   b) a printed circuit card having one or more components attached thereto and one or more integral fastening slots, each slot comprising an internal slot receiving one of said tabs; and
   c) a unitary, stamped-metal top cover having a center, opposite sides, a side rail on each side, and a plurality of prongs extending from each side rail toward the center, said prongs snap-fitted into said apertures in said tabs to join together said top cover and said bottom cover to protectively enclose the card.

6. The printed circuit card assembly according to claim 5 wherein one of said components attached to said printed circuit card comprises:
   a connector having opposite side guides each adapted to guide said printed circuit card into a port in a hardware device, an interface adapted to electrically connect said printed circuit card to said hardware device, and one or more indents each aligned with one of said tabs on the bottom cover;

wherein said top cover has an end with one or more protruding prongs, each prong adapted to snap-fit into the aperture in one of said tabs aligned with said indent.

7. The printed circuit card assembly according to claim 5, wherein said assembly comprises a PCMCIA PC Card assembly.

8. A PCMCIA PC Card assembly comprising:
  a) a unitary, stamped metal bottom cover having a periphery and a plurality of tabs extending perpendicular from the periphery, each tab having an aperture therein;
  b) a printed circuit card having a plurality of internal slots, each slot adapted to receive one of said tabs therethrough;
  c) a unitary, stamped metal top cover having opposite sides, a side rail on each side, and a plurality of prongs extending from each side rail toward a center of the top rail, each prong adapted to snap fit into the aperture in one of said tabs when said top and bottom cover are joined, wherein said bottom cover and said top cover cooperate to provide mechanical strength in the assembly when said prongs are inserted in said apertures in said tabs; and
  d) a connector attached to said printed circuit card, said connector having opposite side guides each adapted to guide said printed circuit card into a port in a hardware device, an interface adapted to electrically connect said printed circuit card to said hardware device, and one or more indents each aligned with one of said tabs on the bottom cover;

wherein said top cover has an end with one or more protruding prongs, each prong adapted to snap-fit into the aperture in one of said tabs aligned with said indent.

* * * * *

UNITED STATES PATENT AND TRADEMARK OFFICE
CERTIFICATE OF CORRECTION

PATENT NO. : 6,191,950 B1                Page 1 of 1
DATED : February 20, 2001
INVENTOR(S) : Wilton L. Cox et al.

It is certified that error appears in the above-identified patent and that said Letters Patent is hereby corrected as shown below:

Column 4,
Line 22, delete "on e" and insert -- one --.

Column 6,
Line 2, delete "rail" and insert -- cover --.

Signed and Sealed this

Twenty-fifth Day of December, 2001

Attest:

JAMES E. ROGAN
Attesting Officer      Director of the United States Patent and Trademark Office